United States Patent [19]
Kikuchi

[11] Patent Number: 5,285,101
[45] Date of Patent: Feb. 8, 1994

[54] SEMICONDUCTOR DEVICE

[75] Inventor: Hiroaki Kikuchi, Tokyo, Japan

[73] Assignee: NEC Corporation, Tokyo, Japan

[21] Appl. No.: 751,113

[22] Filed: Aug. 28, 1991

[30] Foreign Application Priority Data

Aug. 28, 1990 [JP] Japan .................. 2-226132

[51] Int. Cl.$^5$ .............................. H01L 29/72
[52] U.S. Cl. ...................... 257/593; 257/585
[58] Field of Search ................ 357/34, 36, 59 H;
257/560, 585, 593, 563, 565

[56] References Cited

U.S. PATENT DOCUMENTS

| 3,958,267 | 5/1976 | Frederiksen et al. | 357/36 |
| 4,202,005 | 5/1980 | Sanders | 357/51 |
| 5,109,262 | 4/1992 | Kadota et al. | 357/59 H |
| 5,153,694 | 10/1992 | Kishi | 257/593 |

FOREIGN PATENT DOCUMENTS

| 29369 | 5/1981 | European Pat. Off. . |
| 322380 | 6/1989 | European Pat. Off. . |
| 328286 | 8/1989 | European Pat. Off. . |
| 337720 | 10/1989 | European Pat. Off. . |
| 2592526 | 7/1987 | France . |
| 2601504 | 1/1988 | France . |

OTHER PUBLICATIONS

European Search Report for Application No. EP91307871 and Annex thereto, no date.
Proceedings of the 1988 Bipolar Circuits and Technology Meeting, Sep. 12, 1988, Minneapolis, Minn., pp. 199–201; Lj. Ristic et al., "A CMOS bipolar transistor with a locally doped base in the proximity of the emitter as a magnetic field sensor".
Patent Abstracts of Japan, vol. 11, No. 257 (E-534), Aug. 20, 1987, & JP-A-62066672 (Sharp Corp.), Mar. 26, 1987.
Diffusion–Induced Defects in Silicon.I, by E. Levine et al., Journal of Applied Physics, vol. 38, No. 1, pp. 81–87 (Jan. 1967).

Primary Examiner—James W. Davie
Attorney, Agent, or Firm—Burns, Doane, Swecker & Mathis

[57] ABSTRACT

A semiconductor device has an active region composed of an impurity diffused region formed in a substrate. The impurity diffused region is divided into a plurality of impurity diffused sub-regions formed separately from each other in the substrate but electrically coupled to each other.

6 Claims, 20 Drawing Sheets

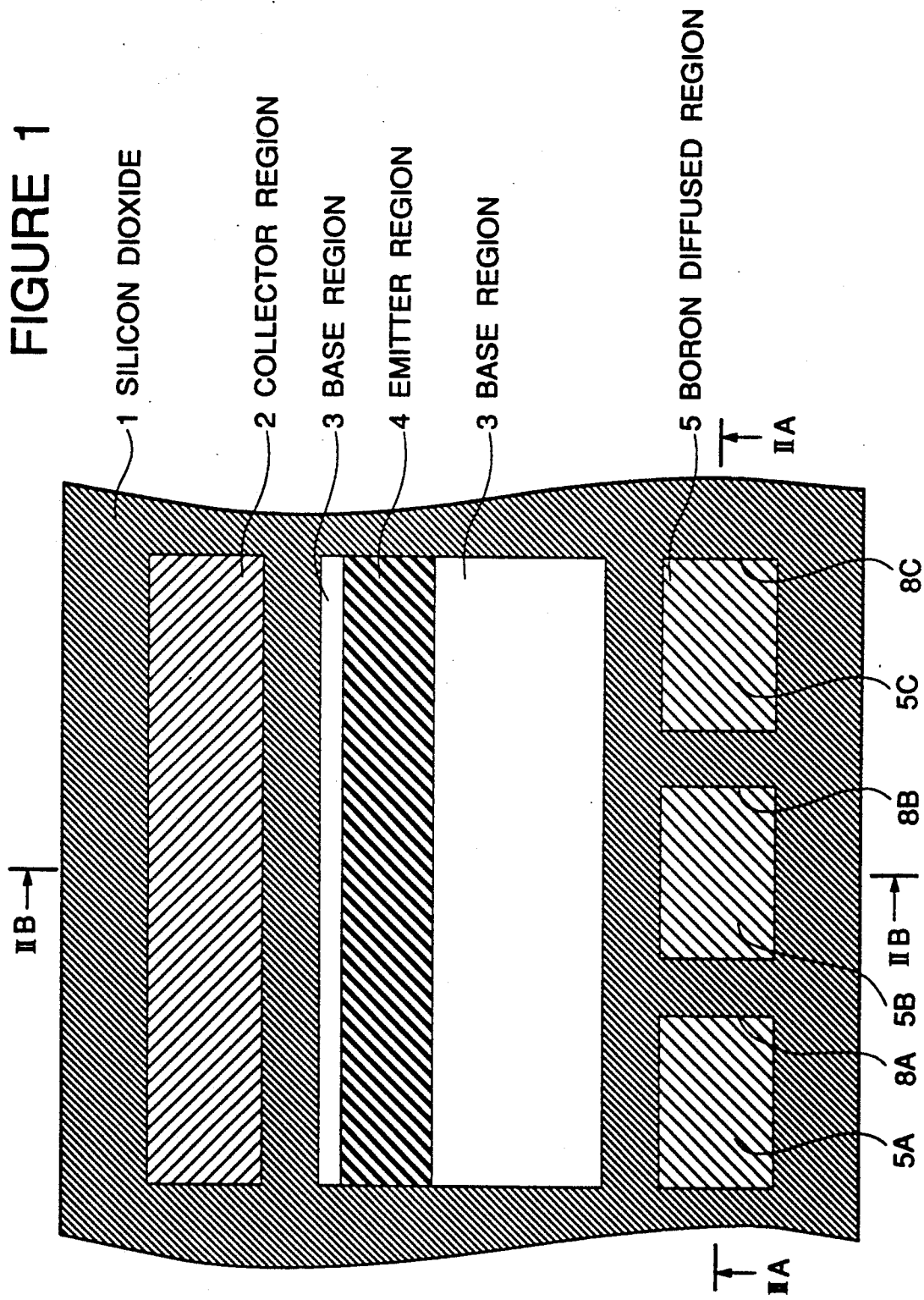

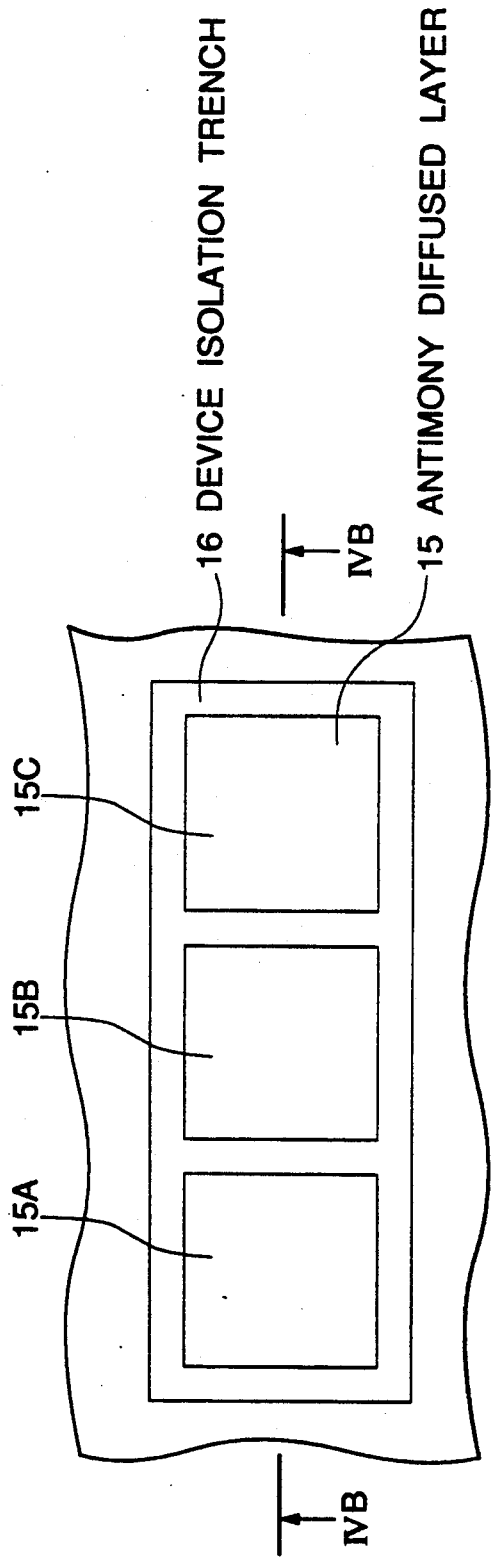
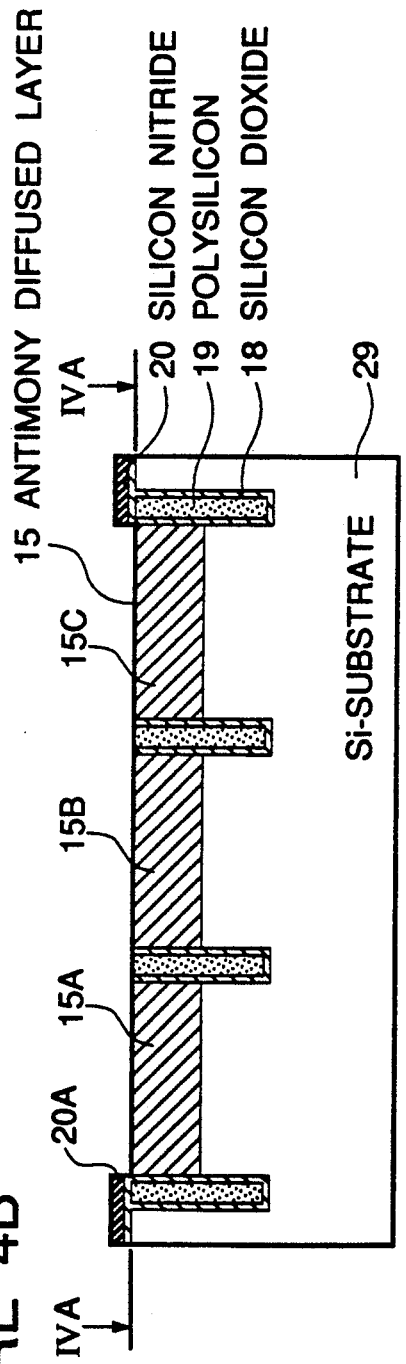
FIGURE 4A
FIGURE 4B

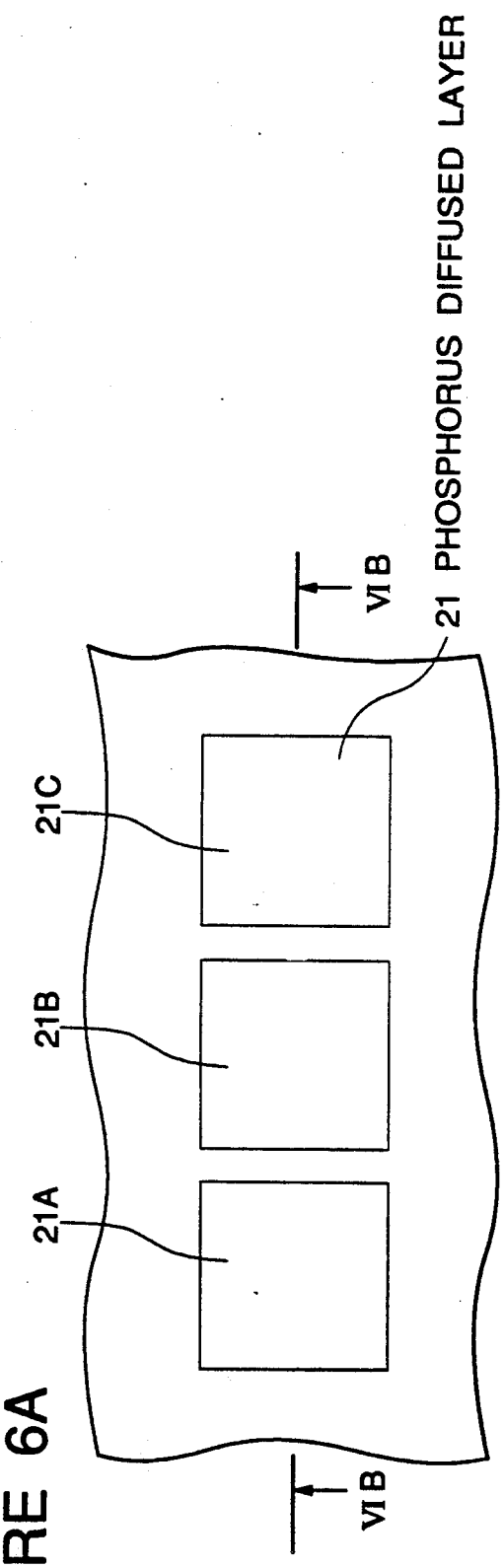
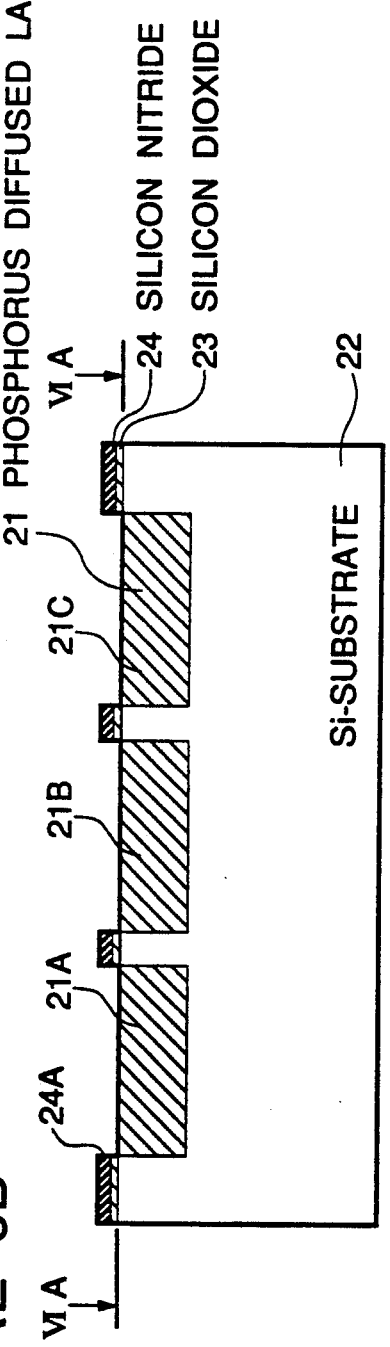
FIGURE 6A
FIGURE 6B

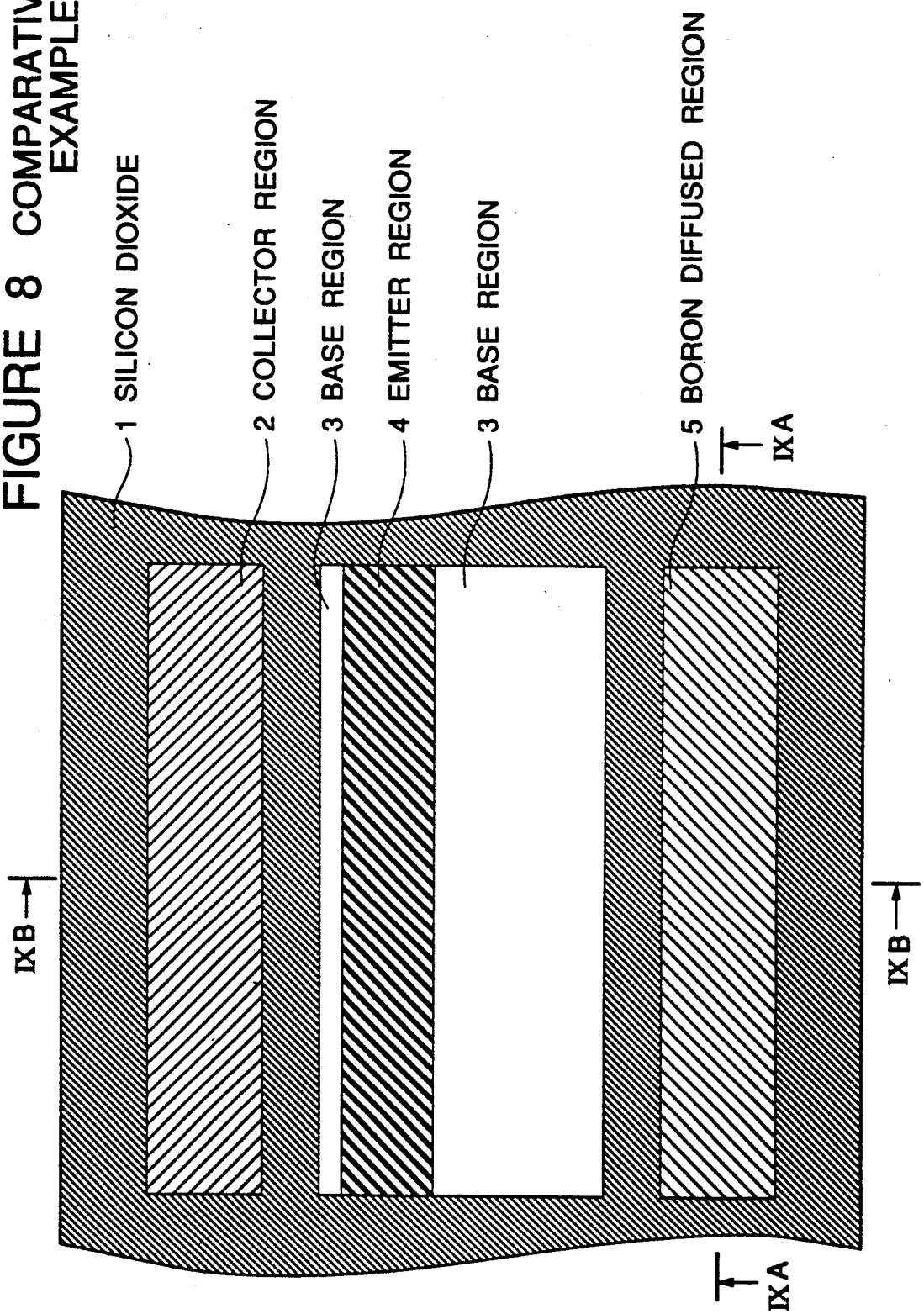
FIGURE 8 COMPARATIVE EXAMPLE
1 SILICON DIOXIDE
2 COLLECTOR REGION
3 BASE REGION
4 EMITTER REGION
3 BASE REGION
5 BORON DIFFUSED REGION

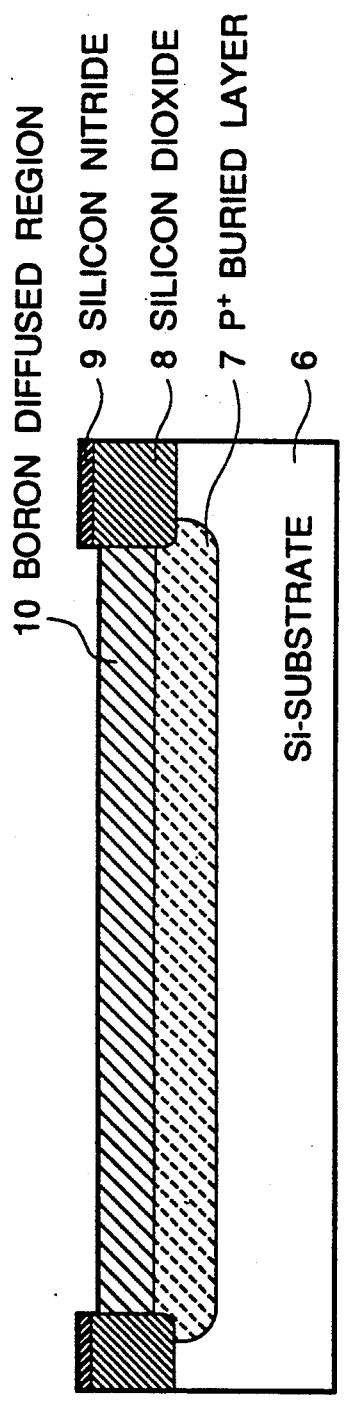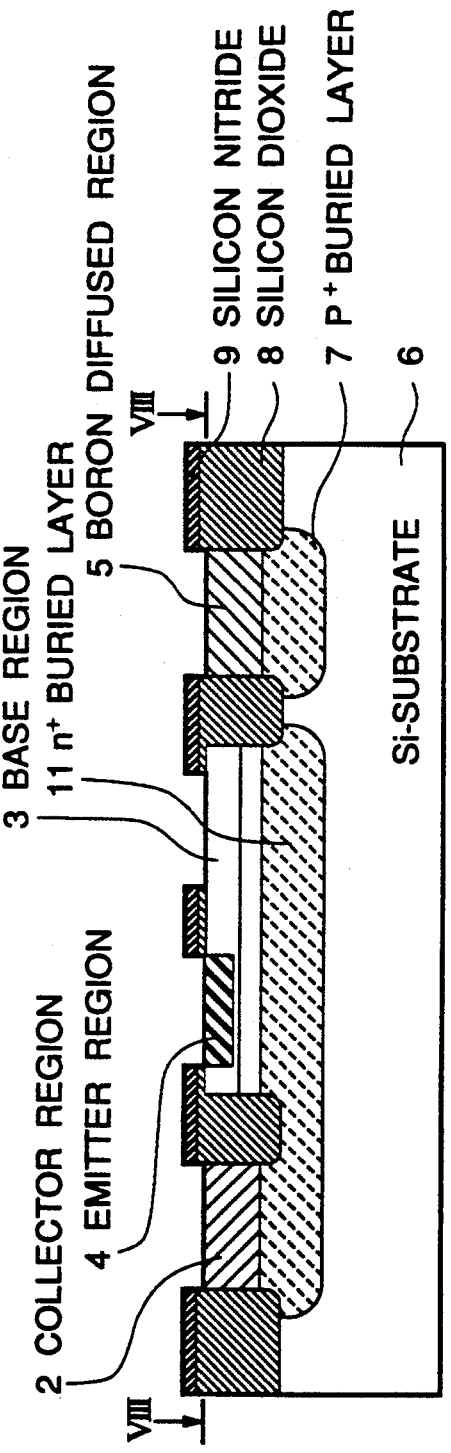

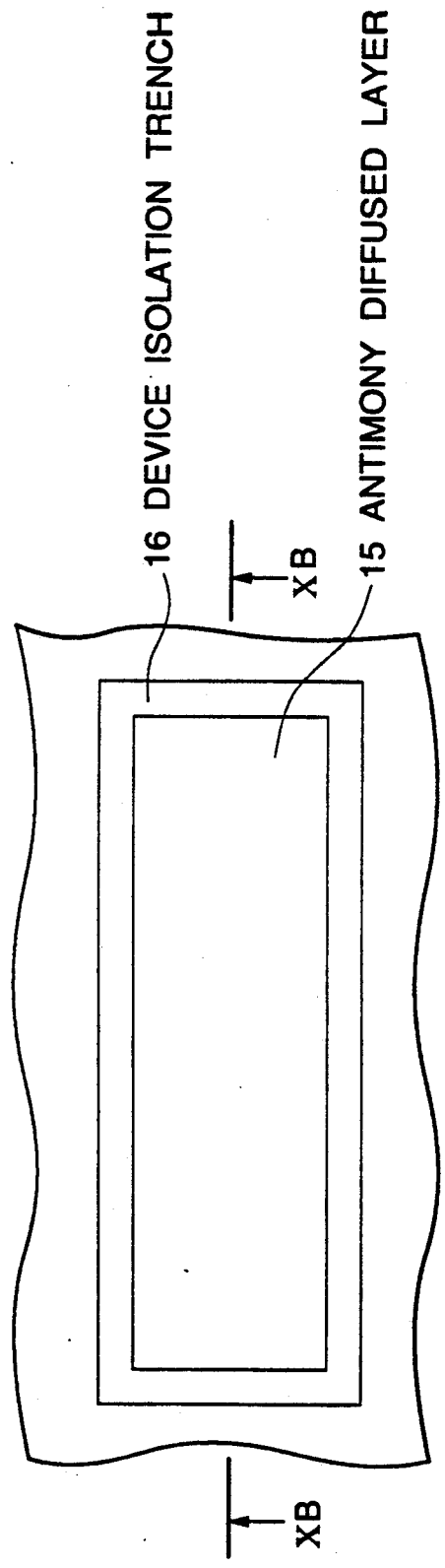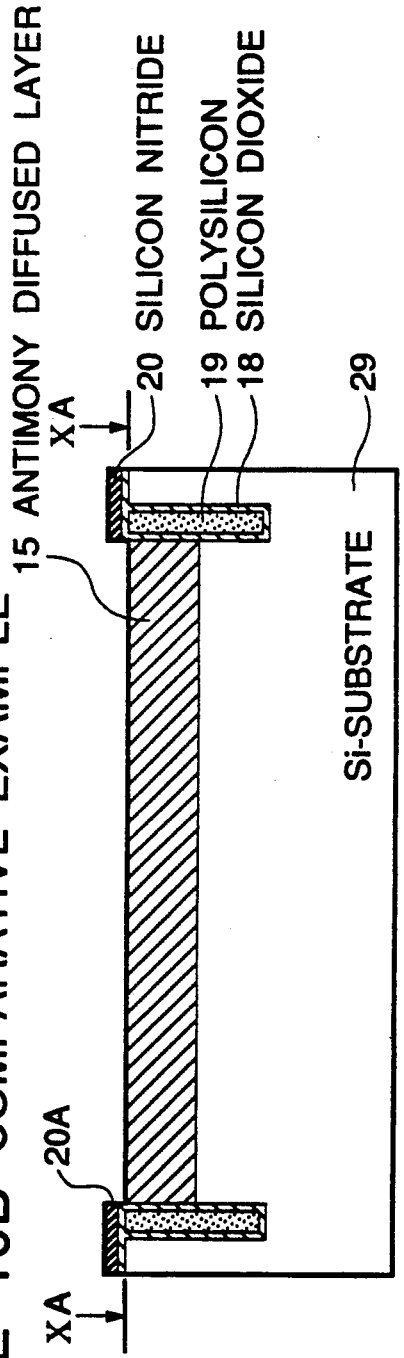
FIGURE 10A COMPARATIVE EXAMPLE
FIGURE 10B COMPARATIVE EXAMPLE

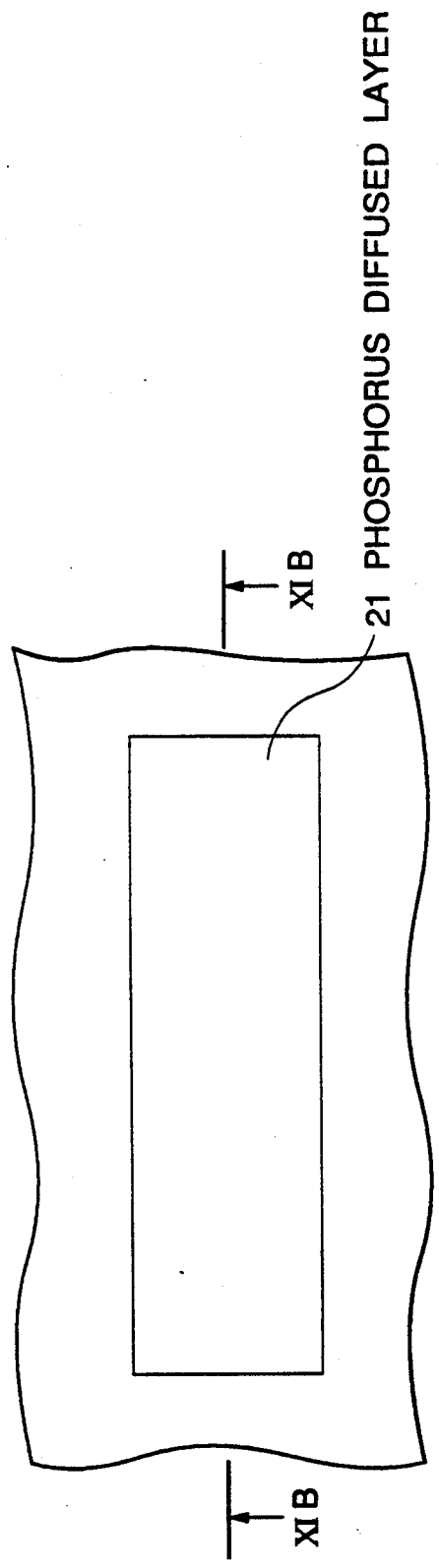
FIGURE 11A COMPARATIVE EXAMPLE
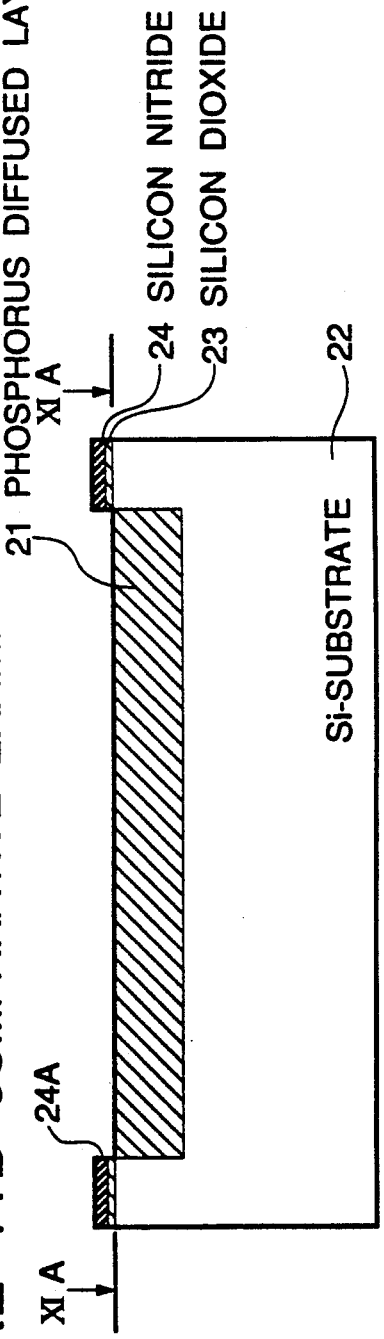
FIGURE 11B COMPARATIVE EXAMPLE

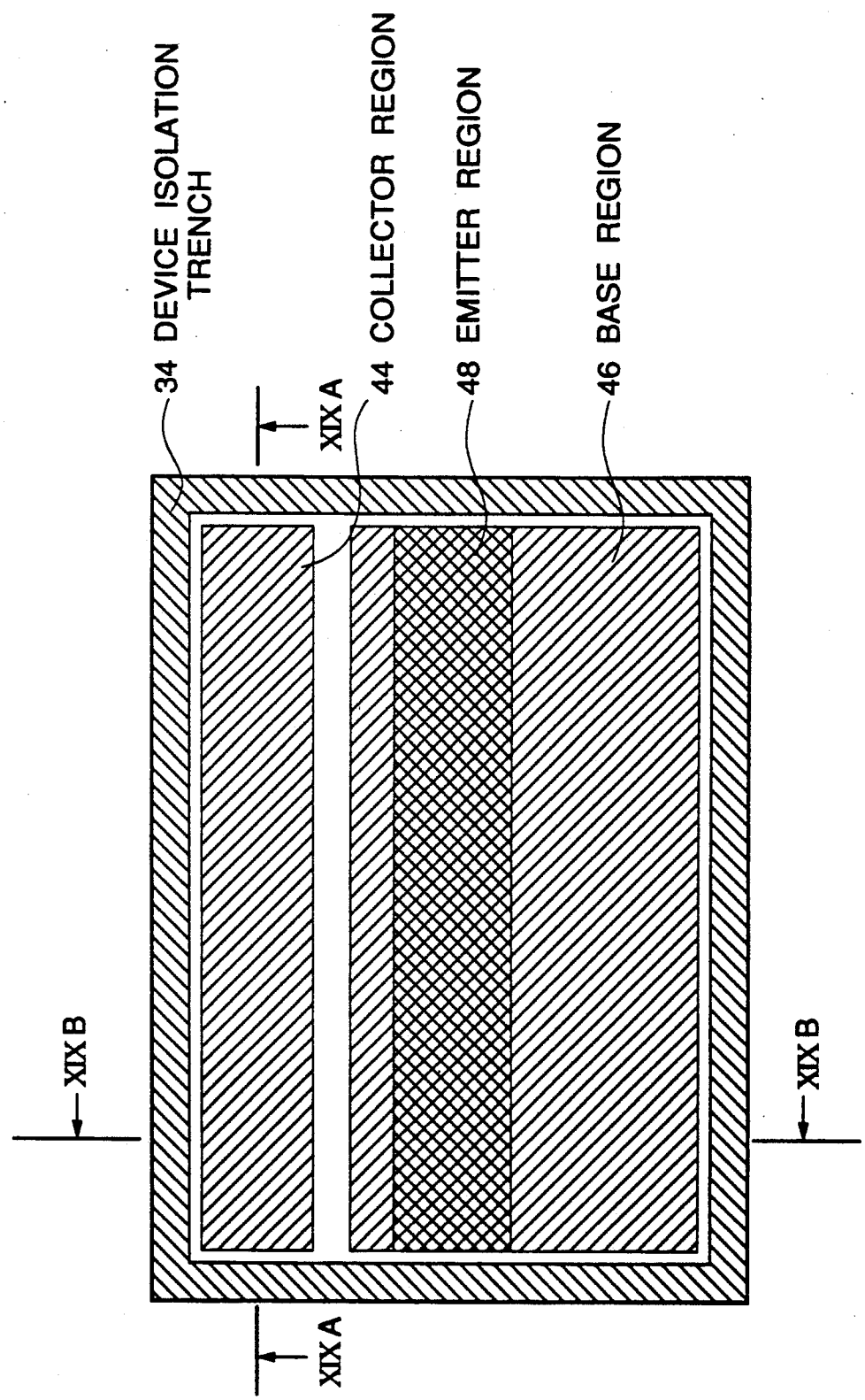
FIGURE 18 COMPARATIVE EXAMPLE

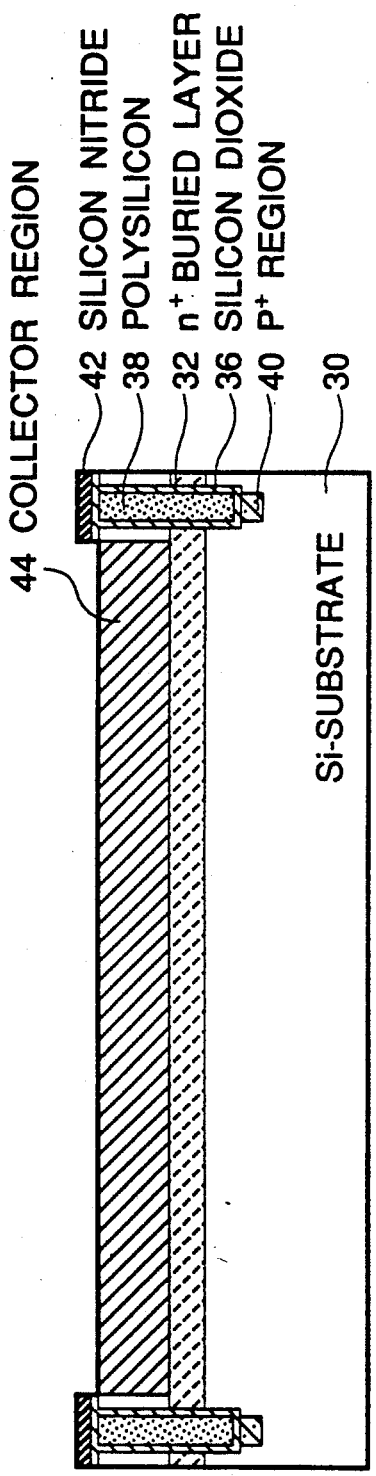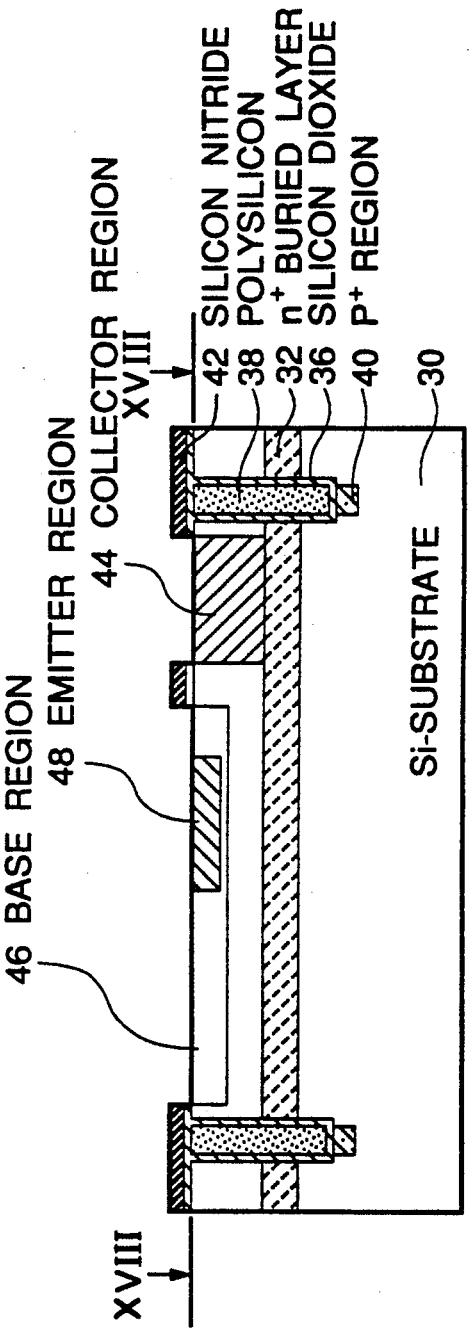

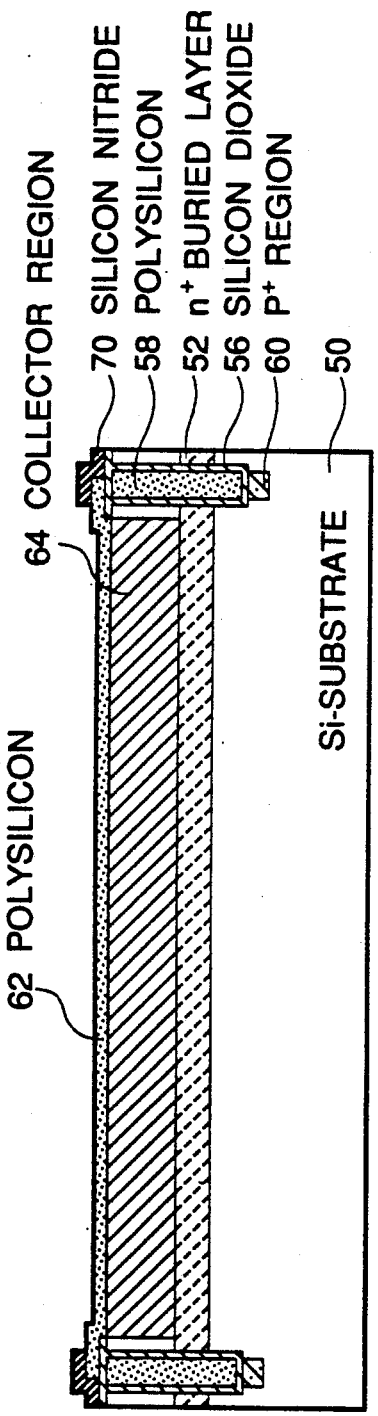
FIGURE 20A  COMPARATIVE EXAMPLE
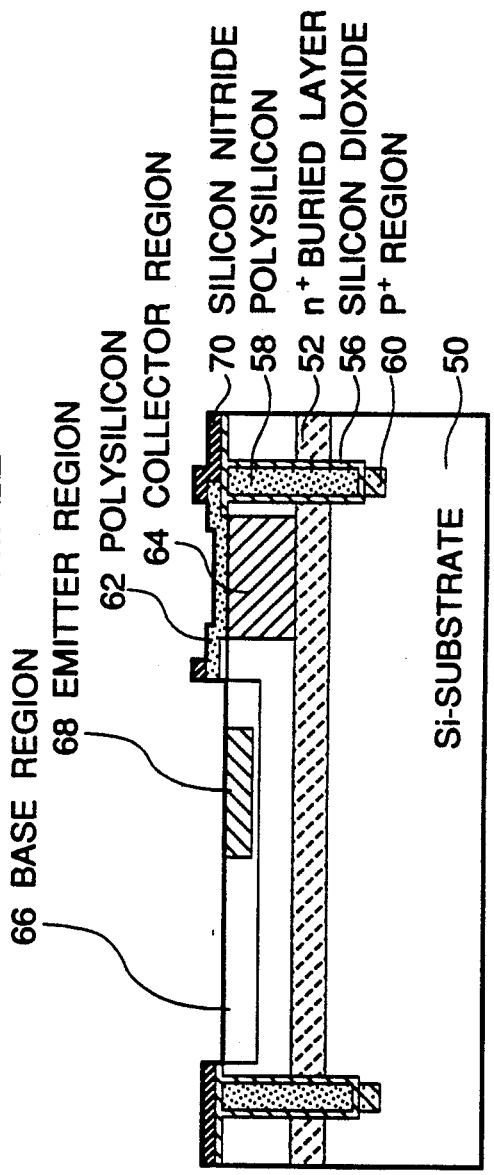
FIGURE 20B  COMPARATIVE EXAMPLE

SEMICONDUCTOR DEVICE

BACKGROUND OF THE INVENTION

1. Field of the Invention

The present invention relates to a semiconductor device, and more specifically to a silicon semiconductor device.

2. Description of Related Art

In conventional semiconductor devices, an impurity diffused region has been formed without being divided, regardless of the size of the impurity diffused region. However, in the case of a silicon substrate, if phosphorus, boron or antimony is diffused at a high degree of concentration, the lattice constant of the impurity diffused region has deviated from an inherent lattice constant of a silicon crystal. If a crystal strain caused by the deviation of the lattice constant exceeds an elastic limit of the silicon, crystal defect (misfit dislocation) occurs in the impurity diffused region and on the periphery of the impurity diffused region. This is well known to persons skilled in the art. For example, it was reported in Journal of Applied Physics, Vol. 38, pp81-87 (1967) that the misfit dislocation occurred in the case of diffusing $P_2O_5$ at 1000° C. for 15 minutes so as to obtain a phosphorus concentration of $3 \times 10^{22}$ atoms/cm$^3$ at a wafer surface. If this misfit dislocation penetrates an emitter-base junction and a base-collector junction of a bipolar transistor and a drain region and a source region of a MOS transistor, it becomes a cause for a junction leakage. Therefore, it has been a conventional practice to set the impurity diffusion concentration at a level which does not allow the misfit to occur.

As seen from the above, in the conventional semiconductor devices, even if it is desired to diffuse impurities at a high degree of concentration so as to reduce a resistance of the impurity diffused region, the impurity concentration has been restrained to prevent misfits which would otherwise occur in a surface of the diffused region because the impurity concentration becomes very high at the surface of the diffused region. As a result, it has not been possible to sufficiently reduce the resistance of the diffused region.

SUMMARY OF THE INVENTION

Accordingly, it is an object of the present invention to provide a semiconductor device which has overcome the above mentioned defect of the conventional one.

Another object of the present invention is to provide a semiconductor device having an impurity diffused region of a reduced resistance without crystal defect and therefore without leakage which would be caused by the crystal defect.

The above and other objects of the present invention are achieved in accordance with the present invention by a semiconductor device having an active region formed of an impurity diffused region which is divided into a plurality of impurity diffused sub-regions separated from each other but electrically coupled to each other.

With the above mentioned arrangement, since each of impurity diffused sub-regions is smaller than the impurity diffused region in the prior art, no misfit dislocation occurs. Therefore, the impurity diffused sub-regions can be diffused with impurities to a degree of concentration which is higher than the impurity concentration of the conventional semiconductor device. Accordingly, the resistance of the impurity diffused region can be sufficiently reduced.

The above and other objects, features and advantages of the present invention will be apparent from the following description of preferred embodiments of the invention with reference to the accompanying drawings.

BRIEF DESCRIPTION OF THE DRAWINGS

FIG. 1 is a diagrammatic plan view, at a level of the line I—I in FIG. 2B, of a first embodiment of the semiconductor device in accordance with the present invention;

FIG. 4A is a diagrammatic plan view, at a level of the line IVA—IVA in FIG. 4B, of a second embodiment of the semiconductor device in accordance with the present invention;

FIG. 4B is a diagrammatic sectional view taken along the line IVB—IVB in FIG. 4A;

FIG. 6A is a diagrammatic plan view, at a level of the line VIA—VIA in FIG. 6B, of a third embodiment of the semiconductor device in accordance with the present invention;

FIG. 6B is a diagrammatic sectional views taken along the line VIB—VIB in FIG. 6A;

FIG. 8 is a diagrammatic plan view, at a level of the line VIII—VIII in FIG. 9B, of a first comparative example of the semiconductor device in accordance with the prior art;

FIGS. 9A and 9B are diagrammatic sectional views taken along the line IXA—IXA and the line IXB—IVB in FIG. 8, respectively;

FIG. 10A is a diagrammatic plan view, at a level of the line XA—XA in FIG. 10B, of a second comparative example of the semiconductor device in accordance with the prior art;

FIG. 10B is a diagrammatic sectional view taken along the line XB—XB in FIG. 10A;

FIG. 11A is a diagrammatic plan view, at a level of the line XIA—XIA in FIG. 11B, of a third comparative example of the semiconductor device in accordance with the prior art;

FIG. 11B is a diagrammatic sectional view taken along the line XIB—XIB in FIG. 11A;

FIG. 18 is a diagrammatic plan view, at a level of the line XVIII—XVIII in FIG. 19B, of a fourth comparative example of the semiconductor device in accordance with the prior art;

FIGS. 19A and 19B are diagrammatic sectional views taken along the line XIXA—XIXA and the line XIXB—XIXB in FIG. 18, respectively; and FIGS. 20A and 20B are views similar to FIGS. 19A and 19B, respectively, but illustrating a fifth comparative example of the semiconductor device in accordance with the prior art.

DESCRIPTION OF THE PREFERRED EMBODIMENTS

Now, various embodiments of the present invention will be described with reference to the accompanying drawings. The embodiments disclosed are silicon bipolar transistors embodying the present invention.

Figure 2A:
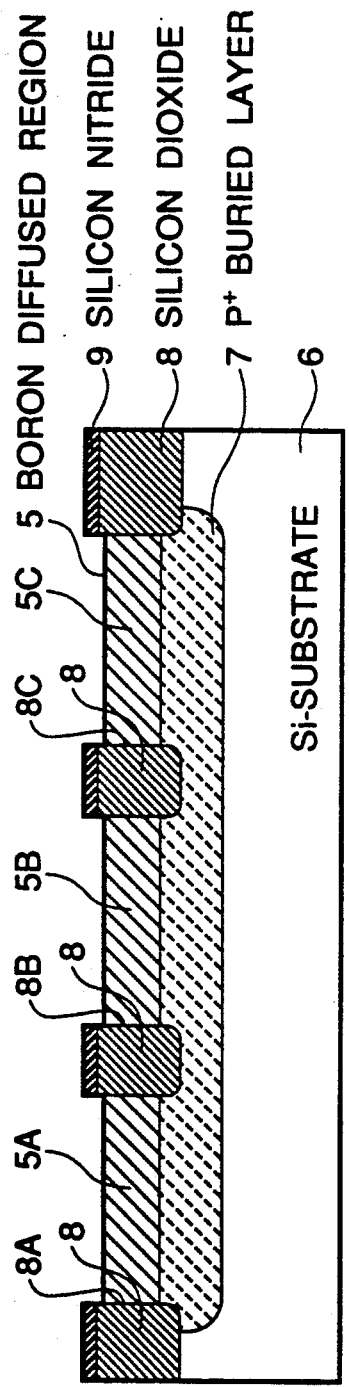
FIGS. 2A and 2B are diagrammatic sectional views taken along the line IIA—IIA and the line IIB—IIB in FIG. 1, respectively.
Figure 2B:
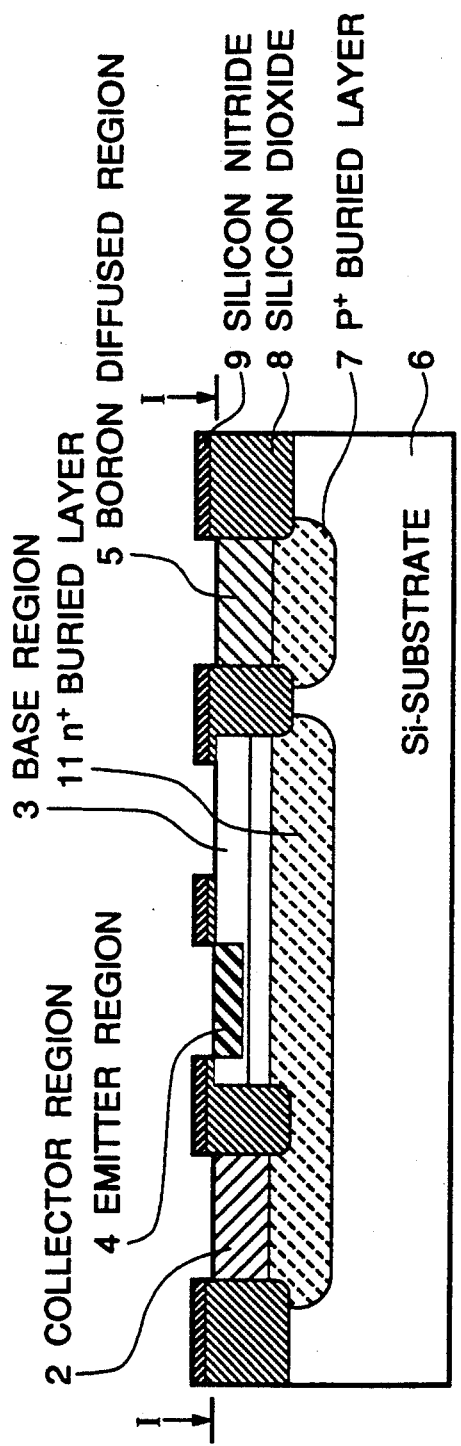

Referring to FIG. 1, there is shown a diagrammatic plan view of a first embodiment of the semiconductor device in accordance with the present invention. FIGS. 2A and 2B are diagrammatic sectional views taken along the line IIA—IIA and the line IIB—IIB in FIG. 1, respectively.

The first embodiment includes a silicon substrate 6 including a boron diffused region 5 formed for electric contact for the substrate, the boron diffused region 5 being divided into a plurality of boron diffused sub-regions 5A, 5B and 5C by a device isolation silicon dioxide 8.

The first embodiment was manufactured as follows: Arsenic (As) was selectively doped in one portion of a P-type silicon substrate 6 having a specific resistance of 10 $\Omega$.cm so as to form an n+ buried layer 11 having a concentration of $5 \times 10^{19}$ atoms/cm$^3$, and boron (B) was selectively doped in another portion of the P-type silicon substrate 6 so as to form a p+ buried layer 7 having a concentration of $2 \times 10^{18}$ atoms/cm$^3$. Then, an n-type epitaxial layer having a thickness of 1 $\mu$m was grown, and a device isolation region 8 of silicon dioxide was formed by using a conventional fine etching technology and a conventional selective oxidation technique. At this time, diffusion windows 8A for forming the boron diffused sub-regions 5A, 5B and 5C were formed by the device isolation region 8, as seen from FIGS. 1, 2A and 2B.

Thereafter, boron was ion-implanted at a dose of $6 \times 10^{15}$ atoms/cm$^2$ through the boron diffused sub-region formation windows 8A, and then, a heat treatment was performed. Thus, the boron diffused sub-regions 5A, 5B and 5C were formed separately from each other as shown in FIGS. 1 and 2A. However, the boron diffused sub-regions 5A, 5B and 5C are electrically connected to each other since these sub-regions form the electric contact for the substrate.

Furthermore, a collector region 2, a base region 3, and an emitter region 4 were formed as shown for example by using a mask formed in a silicon dioxide layer and a silicon nitride layer 9. Thus, a bipolar transistor was formed.

For comparison, as shown in FIGS. 8, 9A and 9B, two comparative examples of the bipolar transistor were formed in accordance with the same process for the first embodiment, except that the boron diffused region 5 was not divided. In FIGS. 8, 9A and 9B, portions corresponding to those shown in FIGS. 1, 2A and 2B were given the same Reference Numerals, and explanation thereof will be omitted for simplification of description. In addition, the ion-implantation dose for the boron diffused region 5 was $1 \times 10^{15}$ atoms/cm$^2$ in a first one of the comparative examples, and $5 \times 10^{15}$ atoms/cm$^2$ in a second one of the comparative examples.

The bipolar transistor in accordance with the first embodiment and the bipolar transistors in accordance with the prior art were examined by a transmission electron microscope so as to know the occurrence of dislocations in the boron diffused region. In the prior art bipolar transistor manufactured with the boron ion-implantation dose of $5 \times 10^{15}$ atoms/cm$^2$, 57 dislocations occurred on the average per a rectangular size of 3 $\mu$m$\times$40 $\mu$m in the boron diffused region. Two dislocations on the average of the found dislocations extended into the base region and/or the collector region. On the other hand, in the bipolar transistor in accordance with the first embodiment and in the prior art bipolar transistor manufactured with the boron ion-implantation dose of $1 \times 10^{15}$ atoms/cm$^2$, no dislocation was found.

Figure 3:
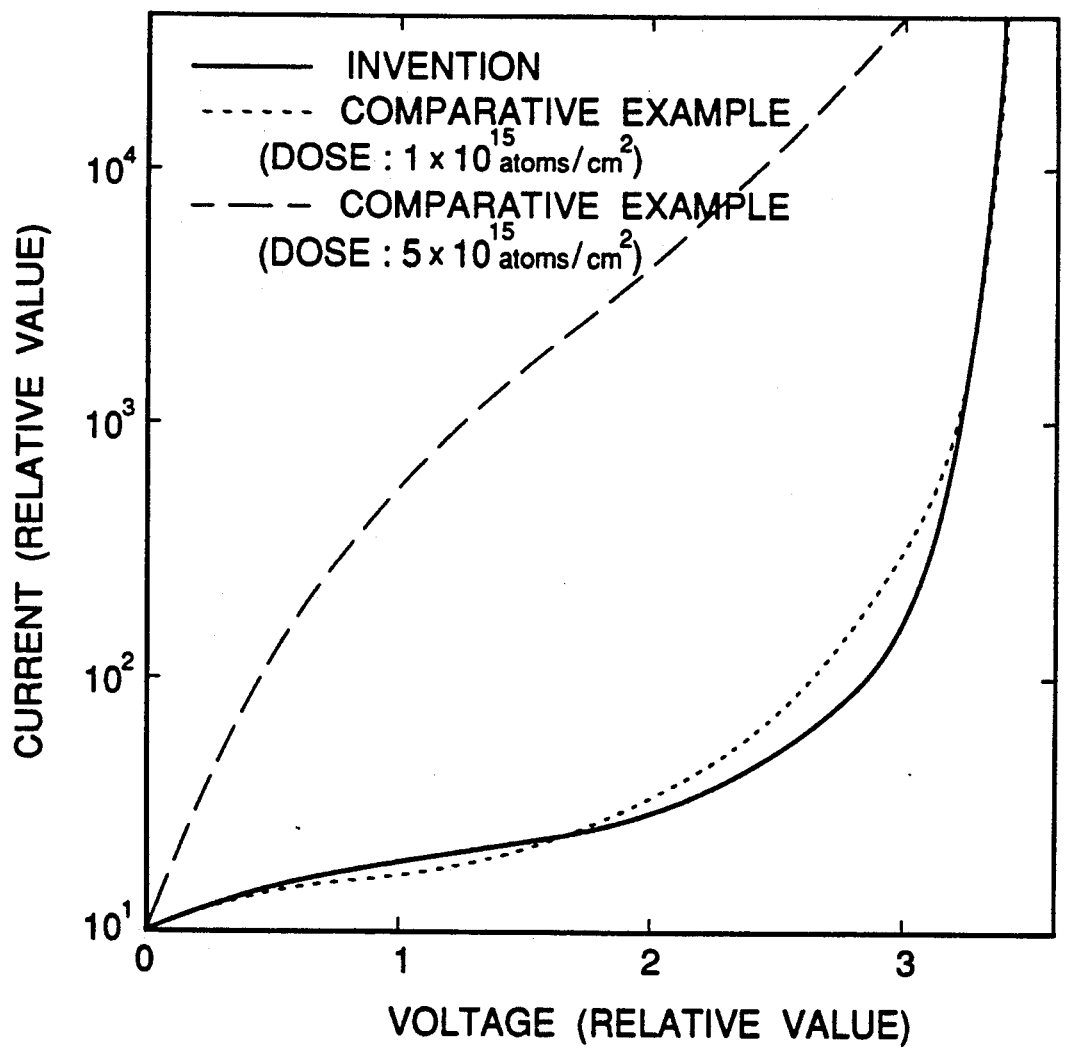
FIG. 3 is a graph illustrating an emitter-base current-voltage characteristics of a bipolar transistor of the first embodiment.

Furthermore, base-emitter current-voltage characteristics were measured. FIG. 3 shows the result of the measurement. The bipolar transistor in accordance with the first embodiment has a leakage current, which is remarkably smaller than that of the prior art bipolar transistor manufactured with the boron ion-implantation dose of $5 \times 10^{15}$ atoms/cm$^2$, and which is comparable to that of the prior art bipolar transistor manufactured with the boron ion-implantation dose of $1 \times 10^{15}$ atoms/cm$^2$.

In addition, the resistance of the boron diffused region was measured. The resistance of the boron diffused region formed with the boron ion-implantation dose of $1 \times 10^{15}$ atoms/cm$^2$ was about five times the resistance of the boron diffused region in the bipolar transistor in accordance with the first embodiment and the boron diffused region formed with the boron ion-implantation dose of $5 \times 10^{15}$ atoms/cm$^2$.

Referring to FIG. 4A there is shown a diagrammatic plan view of a second embodiment of the semiconductor device in accordance with the present invention. FIG. 4B is a diagrammatic sectional view taken along the line IVB—IVB in FIG. 4A. The second embodiment is featured in that an antimony diffused region 15 is divided into a plurality of antimony diffused sub-regions by a device isolation trench 16.

The second embodiment was manufactured as follows: In one portion of a P-type silicon substrate 29 having a specific resistance of 15 $\Omega$.cm, a device isolation trench 16 having a plan pattern as shown was formed by using a conventional fine etching technology, a conventional dry etching, and a polysilicon or silicon oxide growth technique. The device isolation trench 16 is coated with a silicon dioxide layer 18 and filled with a polysilicon 19. Then, an antimony diffusion window 20A was formed in a silicon oxide layer and a silicon nitride layer 20 by heat oxidation of the substrate surface, growth of silicon nitride, and a conventional fine etching technology.

Thereafter, antimony was ion-implanted at a dose of $5 \times 10^{15}$ atoms/cm$^2$ through the diffused sub-region formation windows 20A, and then, a heat treatment was performed at 1200° C. under a nitrogen atmosphere for 5 hours. Thus, a plurality of antimony diffused sub-regions 15A, 15B and 15C were formed separately from each other by the device isolation trench 16, and an n+p junction diode was formed. Similarly to the first embodiment, the antimony diffused sub-regions 15A, 15B and 15C are electrically connected to each other.

For comparison, as shown in FIGS. 10A and 10B, two comparative examples of the n+p junction diode were formed in accordance with the same process for the second embodiment, except that the antimony diffused region 15 was not divided. In FIGS. 10A and 10B, portions corresponding to those shown in FIGS. 4A and 4B were given the same Reference Numerals, and explanation thereof will be omitted for simplification of description. In addition, the ion-implantation dose for the antimony diffused region 15 was $1 \times 10^{15}$ atoms/cm$^2$ in a first one of the comparative examples, and $5 \times 10^{15}$ atoms/cm$^2$ in a second one of the comparative examples.

The n+p diode in accordance with the second embodiment and the n+p diodes in accordance with the prior art were examined by a transmission electron microscope so as to know the occurrence of dislocations in the antimony diffused region. In the prior art n+p diode manufactured with the antimony ion-implantation dose of $5 \times 10^{15}$ atoms/cm$^2$, 34 dislocations occurred on the average per a rectangular size of 3 $\mu$m $\times$ 15 $\mu$m in the antimony diffused region. On the other hand, in the n+p diode in accordance with the second embodiment and in the prior art n+p diode manufactured with the antimony ion-implantation dose of $1 \times 10^{15}$ atoms/cm$^2$, no dislocation was found.

Figure 5:
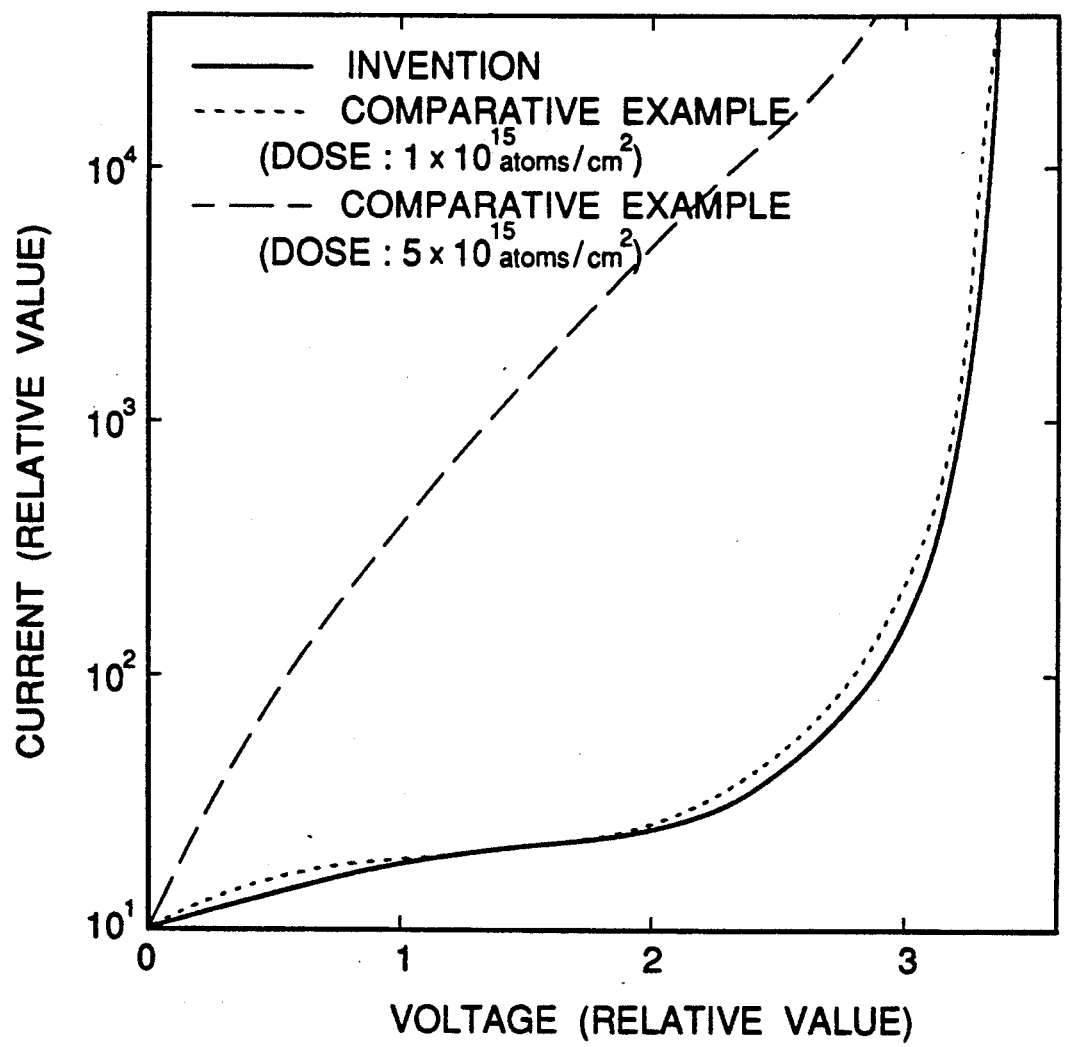
FIG. 5 is a graph illustrating reversed direction emitter-base current-voltage characteristics of a n$^+$p diode of the second embodiment.

Furthermore, reversed direction current-voltage characteristics of the n+p diode were measured. FIG. 5 shows the result of the measurement. It would be understood that the n+p diode in accordance with the second embodiment has a leakage current, which is remarkably smaller than that of the prior art n+p diode manufactured with the antimony ion-implantation dose of $5 \times 10^{15}$ atoms/cm$^2$, and which is comparable to that of the prior art n+p diode manufactured with the antimony ion-implantation dose of $1 \times 10^{15}$ atoms/cm$^2$.

Referring to FIG. 6A there is shown a diagrammatic plan view of a third embodiment of the semiconductor device in accordance with the present invention. FIG. 6B is a diagrammatic sectional view taken along the line VIB—VIB in FIG. 6A. The third embodiment is featured in that a phosphorus diffused region 21 is divided into a plurality of phosphorus diffused sub-regions.

The third embodiment was manufactured as follows: On a P-type silicon substrate 22 having a specific resistance of 10 $\Omega$.cm, a phosphorus diffusion window 24A was formed by forming a silicon oxide layer 23 by heat oxidation of the substrate surface, by forming a silicon nitride layer 24 by growth of silicon nitride, and by selectively etching the stacked double layer by a conventional fine etching technology.

Thereafter, phosphorus was ion-implanted at a dose of $6 \times 10^{15}$ atoms/cm$^2$ through the diffused sub-region formation windows 24A, and then, a heat treatment was performed at 1100° C. under a nitrogen atmosphere for 2 hours. Thus, a plurality of phosphorus diffused sub-regions 21A, 21B and 21C were formed separately from each other, and an n+p junction diode was formed.

Similarly to the first embodiment, the phosphorus diffused sub-regions 21A, 21B and 21C are electrically connected to each other.

For comparison, as shown in FIG. 11A and 11B, two comparative examples of the n+p junction diode were formed in accordance with the same process for the third embodiment, except that the phosphorus diffused region 21 was not divided. In FIGS. 11A and 11B, portions corresponding to those shown in FIGS. 6A and 6B were given the same reference numerals, and explanation thereof will be omitted for simplification of description. In addition, the ion-implantation dose for the phosphorus diffused region 21 was $1 \times 10^{15}$ atoms/cm$^2$ in a first one of the comparative examples, and $5 \times 10^{15}$ atoms/cm$^2$ in a second one of the comparative examples.

The n+p diode in accordance with the third embodiment and the n+p diodes in accordance with the prior art were examined by a transmission electron microscope so as to know the occurrence of dislocations in the phosphorus diffused region. In the prior art n+p diode manufactured with the phosphorus ion-implantation dose of $6 \times 10^{15}$ atoms/cm$^2$, 37 dislocations occure on the average per a rectangular size of 4 $\mu$m $\times$ 10 $\mu$m in the phosphorus diffused region. On the other hand, in the n+p diode in accordance with the third embodiment and in the prior art n+p diode manufactured with the phosphorus ion-implantation dose of $1 \times 10^{15}$ atoms/cm$^2$, no dislocation was found.

Figure 7:
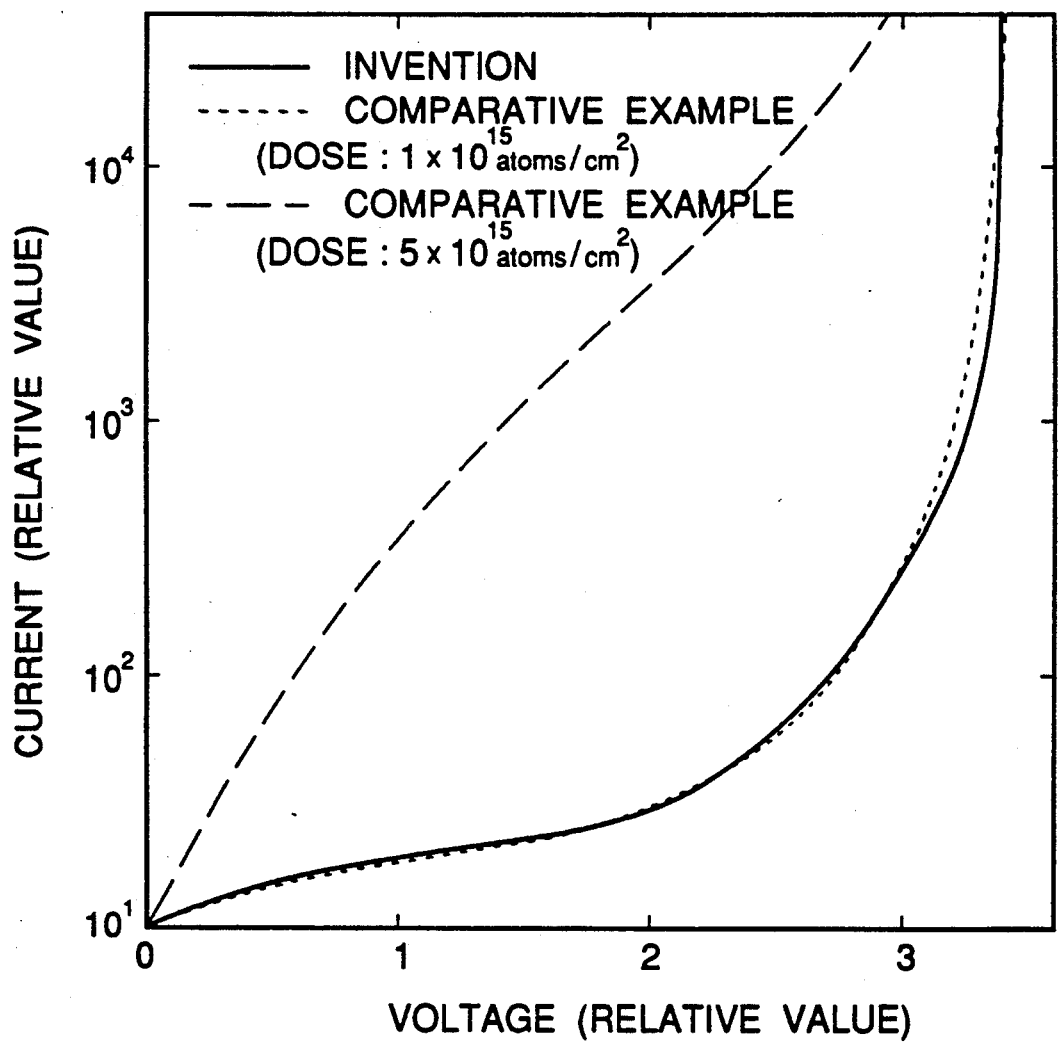
FIG. 7 is a graph illustrating reversed direction emitter-base current-voltage characteristics of a n$^+$p diode of the third embodiment.

Furthermore, reversed direction current-voltage characteristics of the n+p diode were measured. FIG. 7 shows the result of the measurement. The n+p diode in accordance with the third embodiment has a leakage current, which is remarkably smaller than that of the prior art n+p diode manufactured with the phosphorus ion-implantation dose of $6 \times 10^{15}$ atoms/cm$^2$, and which is comparable to that of the prior art n+p diode manufactured with the phosphorus ion-implantation dose of $1 \times 10^{15}$ atoms/cm$^2$.

Figure 12:
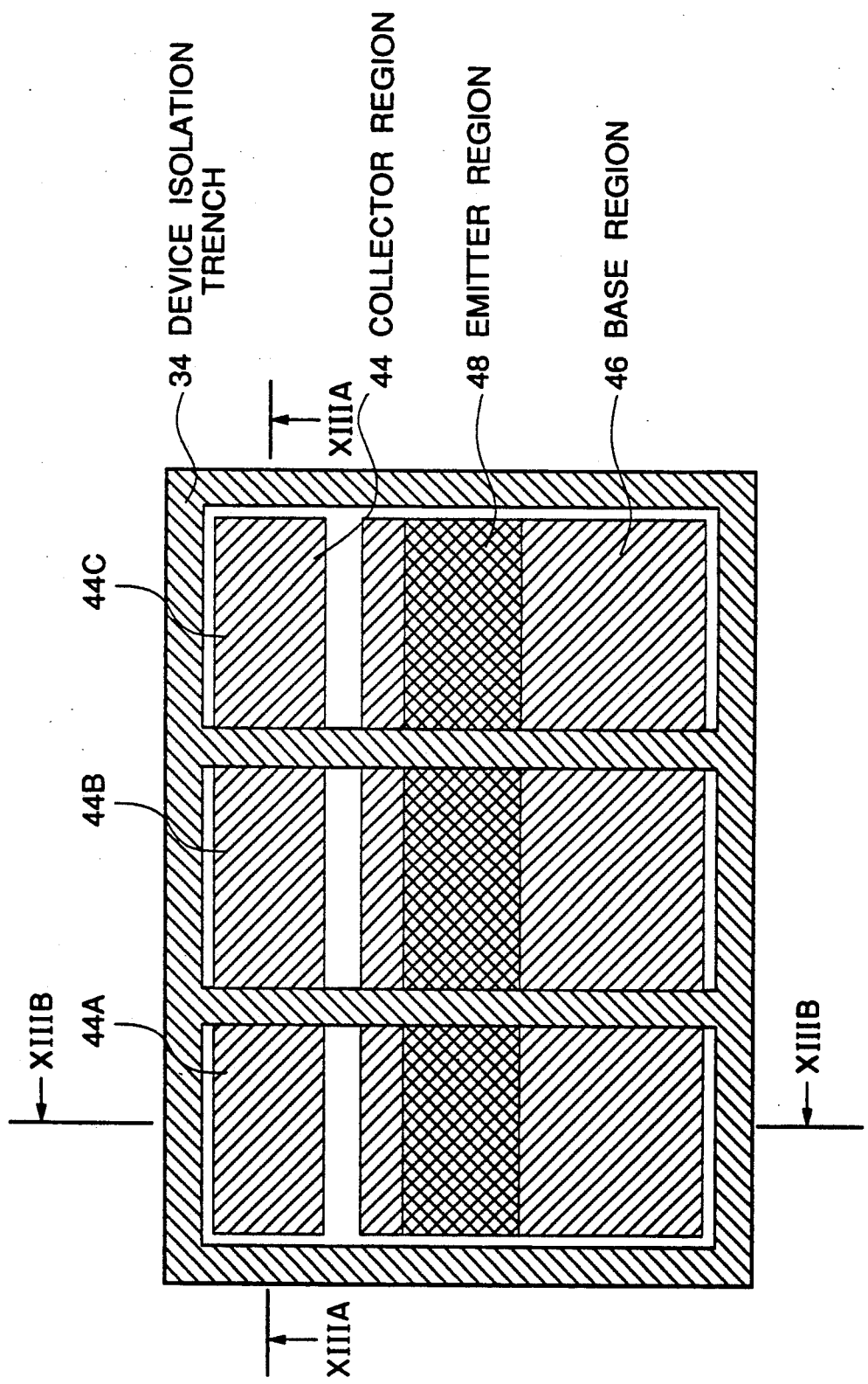
FIG. 12 is a diagrammatic plan view, at a level of the line XII—XII in FIG. 13B, of a fourth embodiment of the semiconductor device in accordance with the present invention.
Figure 13A:
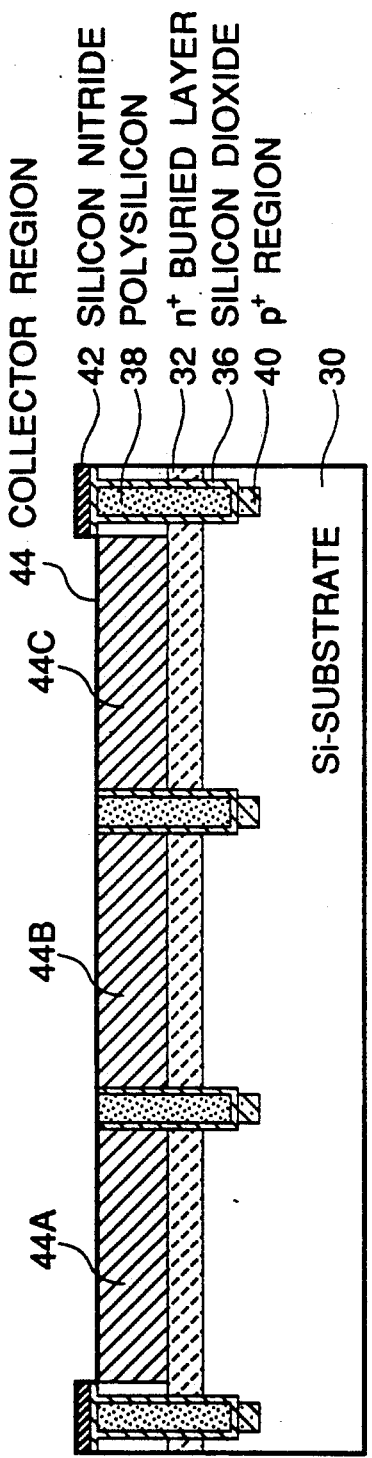
FIGS. 13A and 13B are diagrammatic sectional views taken along the line XIIIA—XIIIA and the line XIIIB—XIIIB in FIG. 12, respectively.
Figure 13B:
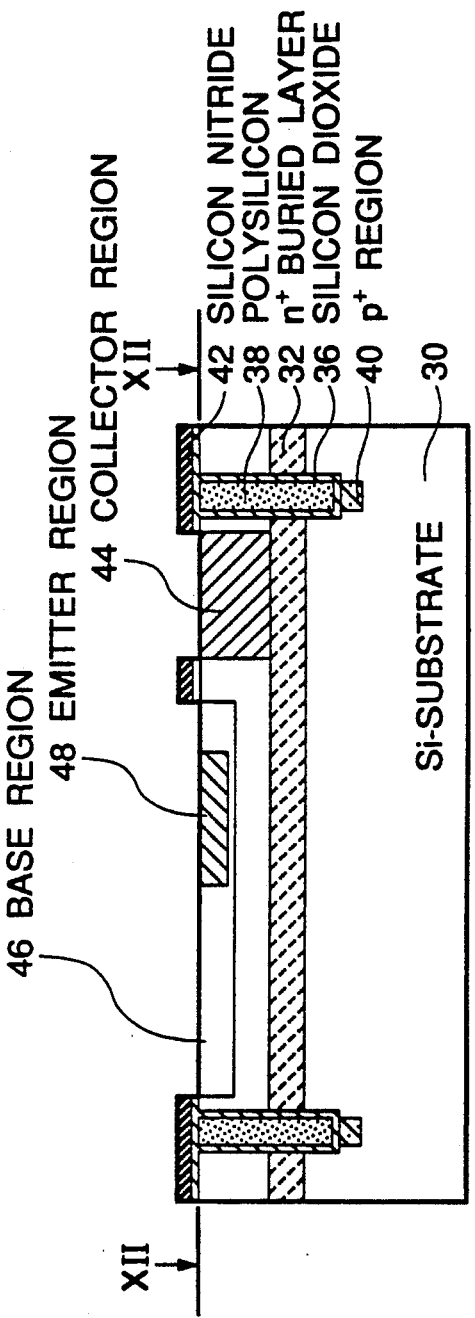

Referring to FIG. 12, there is shown a diagrammatic plan view of a fourth embodiment of the semiconductor device in accordance with the present invention. FIGS. 13A and 13B are diagrammatic sectional views taken along the line XIIIA—XIIIA and the line XIIIB—XIIIB in FIG. 12, respectively. The fourth embodiment is featured in that a collector region is divided into a plurality of collector sub-regions by a device isolation trench.

The fourth embodiment was manufactured as follows: Arsenic (As) was selectively doped in one portion of a P-type silicon substrate 30 having a specific resistance of 10 $\Omega$.cm so as to form an n+ buried layer 32 having a concentration of $5 \times 10^{19}$ atoms/cm$^3$. Then, an n-type epitaxial layer having a thickness of 1 $\mu$m was grown, and a device isolation trench 34 was formed by a conventional fine etching technology, a conventional dry etching method and a conventional polysilicon growth technique. The device isolation trench 34 is coated with a silicon dioxide layer 36 and filled with a polysilicon 38. Under the device isolation trench 34, a stopper 40 of a p+ region is formed. Thereafter, a collector diffusion window was formed by forming a silicon oxide layer by heat oxidation of the substrate surface, by forming a silicon nitride layer 42 by growth of silicon nitride, and by selectively etching the stacked double layer by a conventional fine etching technology. Then, using a carrier gas composed of a mixed gas of nitrogen and oxygen and including 1000 ppm of POCl$_3$, diffusion was performed at 950° C. for 15 minutes. In addition, phosphorus was further diffused at 1000° C. under a nitrogen atmosphere for 20 minutes, so that a collector region 44 was formed. This collector region was divided into collector sub-regions 44A, 44B and 44C separately from each other by the device isolation trench 34. Thereafter, a base region 46 and an emitter region 48 were formed by an ion-implantation process. Similarly to the first embodiment, the collector sub-regions 44A, 44B and 44C are electrically connected to each other.

For comparison, as shown in FIGS. 18, 19A and 19B, two comparative examples of the bipolar transistor were formed in accordance with the same process for the fourth embodiment, except that the collector region 44 was not divided. In FIGS. 18, 19A and 19B, portions corresponding to those shown in FIGS. 12, 13A and 13B were given the same reference numerals, and explanation thereof will be omitted for simplification of description. In addition, in a first one of the comparative examples, phosphorus was diffused by using 1000 ppm of $POCl_3$ at 950° C. for 6 minutes, and in a second one of the comparative examples, phosphorus was diffused by using 1000 ppm of $POCl_3$ at 950° C. for 15 minutes.

The bipolar transistor in accordance with the fourth embodiment and the bipolar transistors in accordance with the prior art were examined by a transmission electron microscope so as to known the occurrence of dislocations in the boron diffused region. In the prior art bipolar transistor manufactured with the phosphorus diffusion of 15 minutes, 26 dislocations occurred on the average per a rectangular size of 2 $\mu m \times 20$ $\mu m$ in the collector region. Two dislocations on the average of the found dislocations extended into the base region and the emitter region. On the other hand, in the bipolar transistor in accordance with the fourth embodiment and in the prior art bipolar transistor manufactured with the phosphorus diffusion of 6 minutes, no dislocation was found.

Figure 14:
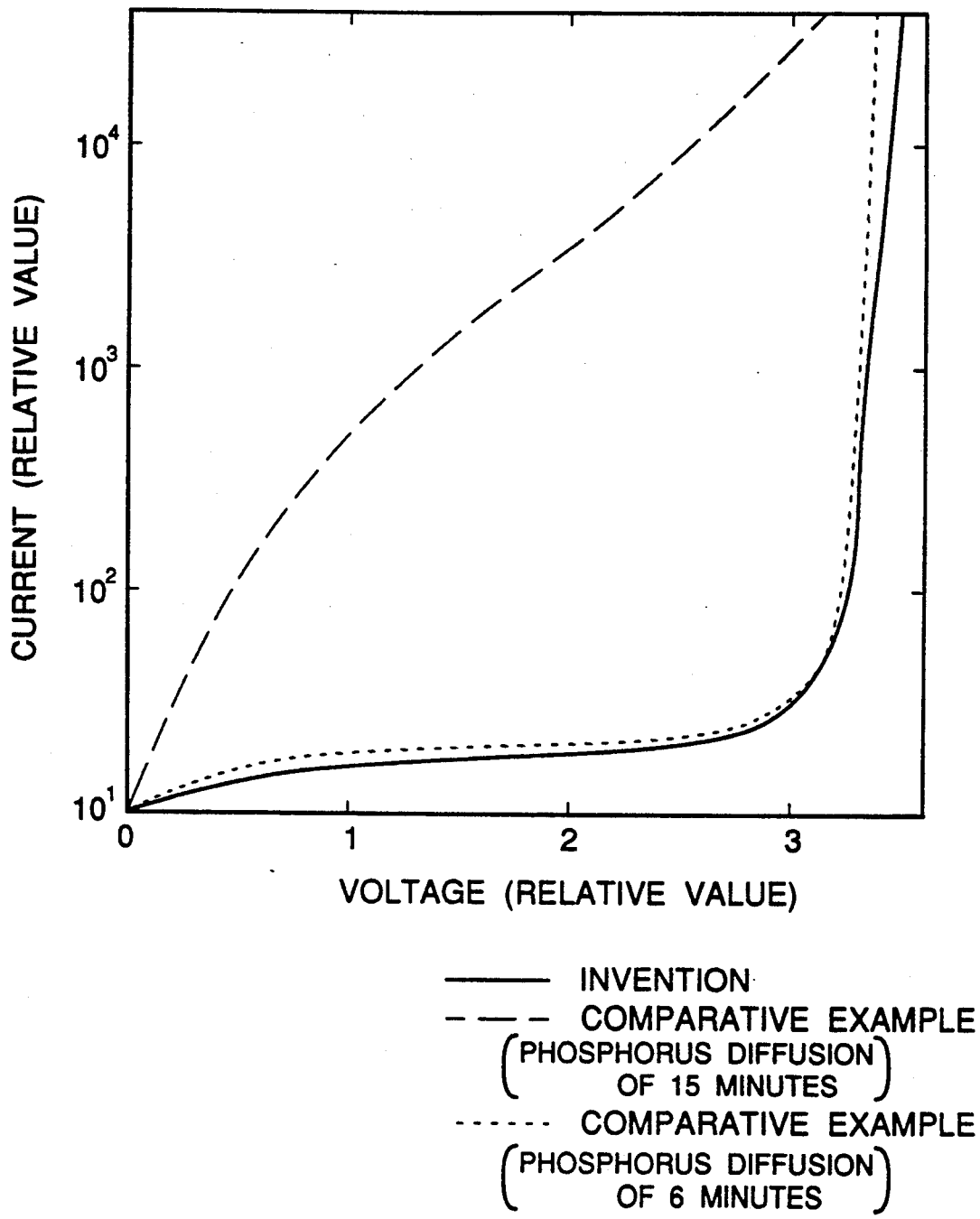
FIG. 14 is a graph illustrating collector-emitter current-voltage characteristics of a bipolar transistor of the fourth embodiment.

Furthermore, collector-emitter current-voltage characteristics were measured. FIG. 14 shows the result of the measurement. The bipolar transistor in accordance with the fourth embodiment has a leakage current, which is remarkably smaller than that of the prior art bipolar transistor manufactured with the phosphorus diffusion of 15 minutes, and which is comparable to that of the prior art bipolar transistor manufactured with the phosphorus diffusion of 6 minutes.

In addition, cutoff frequency which is one index indicative of a high frequency operation performance of the bipolar transistor was measured. The bipolar transistor in accordance with the fourth embodiment had a cutoff frequency which was 1.3 times the cutoff frequency of the prior art bipolar transistor manufactured with the phosphorus diffusion of 6 minutes. This improvement of the cutoff frequency is considered to have been obtained because the resistance of the collector region was reduced without occurrence of dislocation in the collector region.

Figure 15:
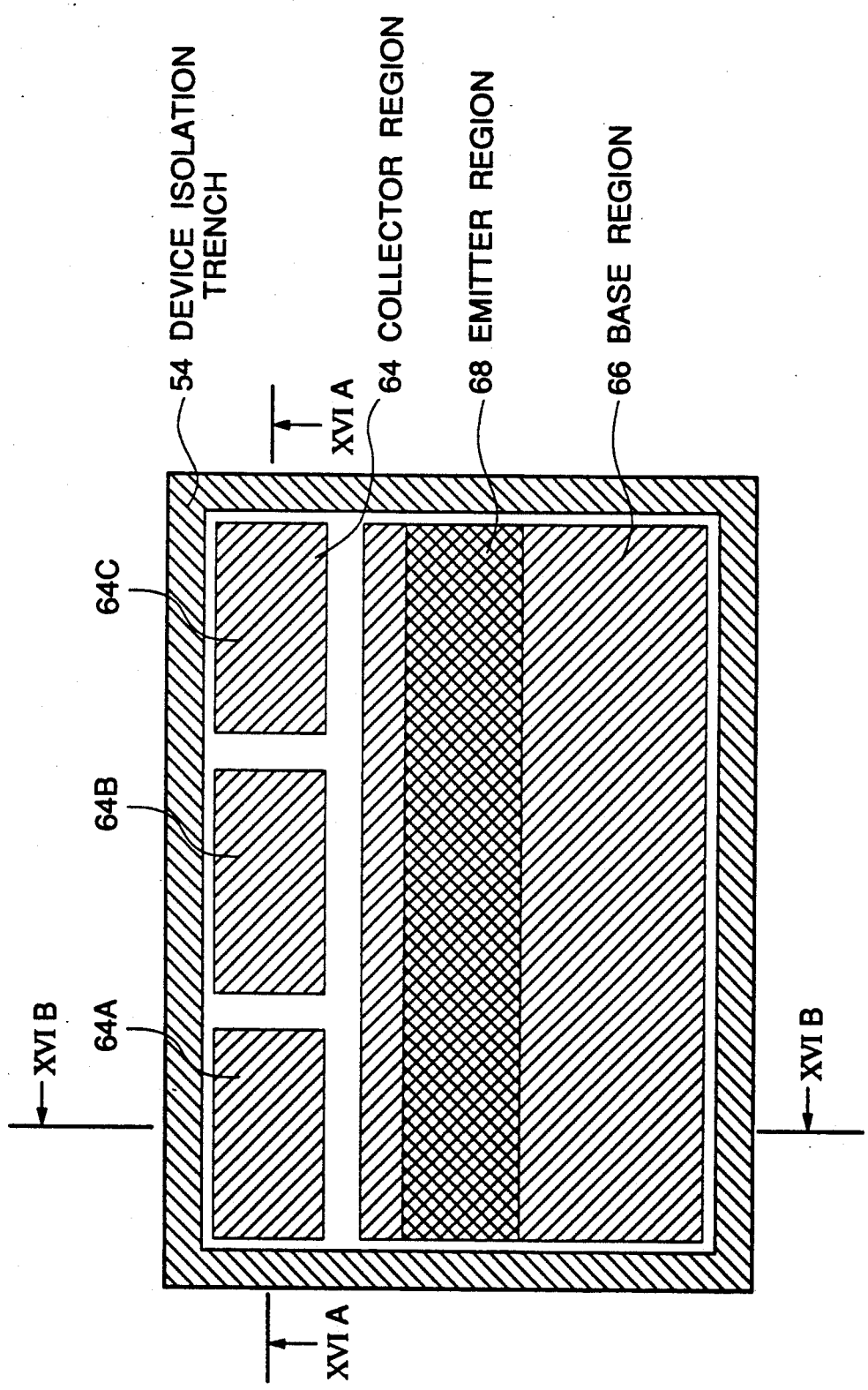
FIG. 15 is a diagrammatic plan view, at a level of the line XV—XV in FIG. 16B, of a fifth embodiment of the semiconductor device in accordance with the present invention.
Figure 16A:
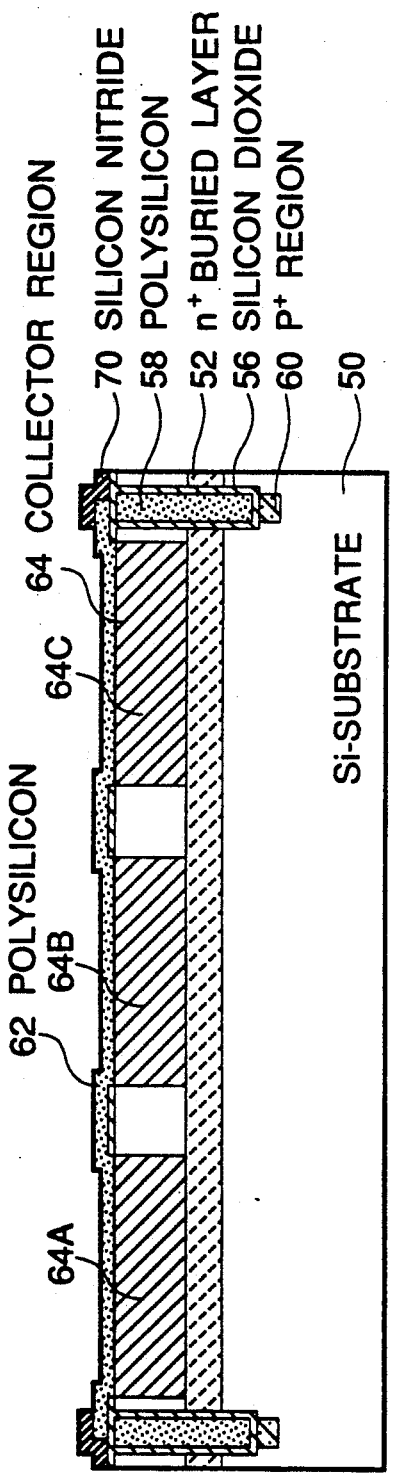
FIGS. 16A and 16B are diagrammatic sectional views taken along the line XVIA—XVIA and the line XVIB—XVIB in FIG. 15, respectively.
Figure 16B:
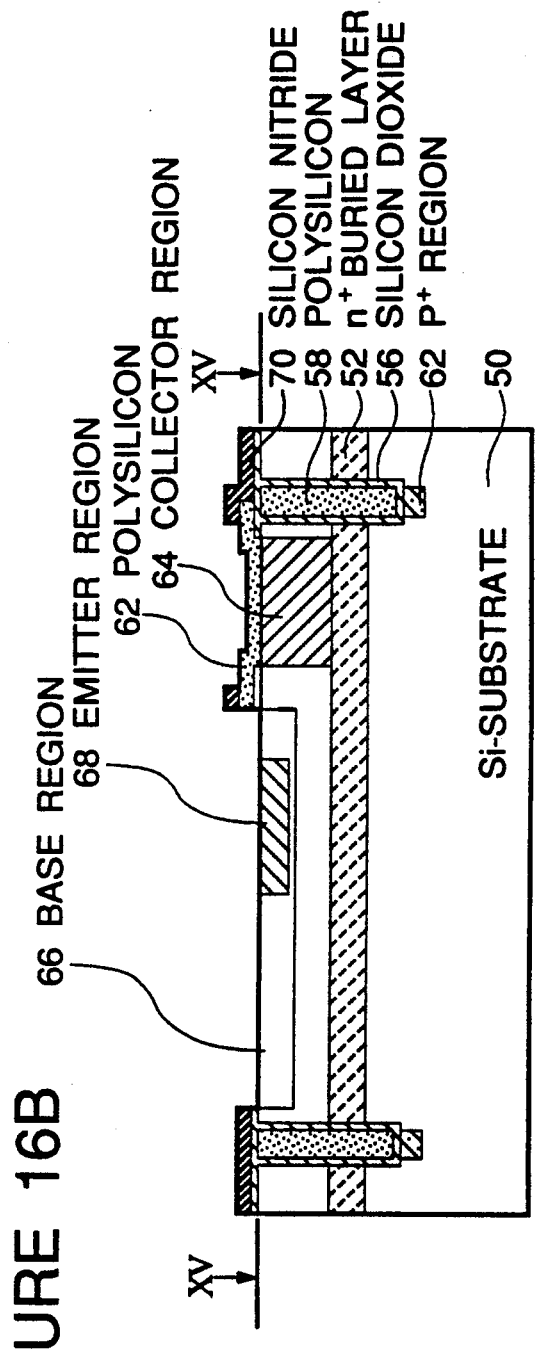

Referring to FIG. 15, there is shown a diagrammatic plan view of a fifth embodiment of the semiconductor device in accordance with the present invention. FIGS. 16A and 16B are diagrammatic sectional views taken along the line XVIA—XVIA and the line XVIB—XVIB in FIG. 15, respectively. The fifth embodiment is featured in that a collector region is divided into a plurality of collector sub-regions without using a device isolation trench.

The fifth embodiment was manufactured as follows: Similarly to the fourth embodiment, arsenic (As) was selectively doped in one portion of a P-type silicon substrate 50 having a specific resistance of 10 $\Omega$. cm so as to form an n+ buried layer 52. Then, an n-type epitaxial layer having a thickness of 1 $\mu m$ was grown, and a device isolation trench 54 was formed by a conventional fine etching technology, a conventional dry etching method and a conventional polysilicon growth technique. The device isolation trench 54 is coated with a silicon dioxide layer 56 and filled with a polysilicon 58. Under the device isolation trench 54, a stopper 60 of a p+ region is formed. Thereafter a collector diffusion window was formed by forming a silicon oxide layer by heat oxidation of the substrate surface, by forming a silicon nitride layer by growth of silicon nitride, and by selectively etching the stacked double layer by a conventional fine etching technology. This collector diffusion window was into three portions, for example, in this fifth embodiment. Furthermore, a polysilicon layer 62 is formed on the collector diffusion window by growth of a polysilicon and a conventional fine etching technology. Then, using a carrier gas composed of a mixed gas of nitrogen and oxygen and including 1000 ppm of $POCl_3$, diffusion was performed at 950° C. for 15 minutes. In addition, phosphorus was further diffused at 1000° C. under a nitrogen atmosphere for 20 minutes, so that a collector region 64 was formed. This collector region was divided into collector sub-regions 64A, 64B and 64C separately from each other by the three collector diffusion windows. But, the collector sub-regions 64A, 64B and 64C are electrically connected to each other by the phosphorus diffused polysilicon layer 62. Thereafter, a base region 66 and an emitter region 68 were formed by an ion-implantation process, by utilizing for example a silicon nitride layer 70.

For comparison, as shown in FIGS. 20A and 20B, two comparative examples of the bipolar transistor were formed in accordance with the same process for the fifth embodiment, except that the collector region 64 was not divided. A plan view of these comparative examples is the same as FIG. 18, and therefore, the plan view will be omitted. In FIGS. 20A and 20B, portions coresponding to those shown in FIGS. 15, 16A and 16B were given the same reference numerals, and explanation thereof will be omitted for simplification of description. In addition, in a first one of the comparative examples, phosphorus was diffused by using 1000 ppm of $POCl_3$ at 950° C. for 6 minutes, and in a second one of the comparative examples, phosphorus was diffused by using 1000 ppm of $POCl_3$ at 950° C. for 15 minutes.

The bipolar transistor in accordance with the fifth embodiment and the bipolar transistors in accordance with the prior art were examined by a transmission electron microscope so as to know the occurrence of dislocations in the boron diffused region. In the prior art bipolar transistor manufactured with the phosphorus diffusion of 15 minutes, 27 dislocations occurred on the average per a rectangular size of 2 $\mu m \times 20$ $\mu m$ in the collector region. Two dislocations on the average of the found dislocations extended into the base region and the emitter region. On the other hand, in the bipolar transistor in accordance with the fifth embodiment and in the prior art bipolar transistor manufactured with the phosphorus diffusion of 6 minutes, no dislocation was found.

Figure 17:
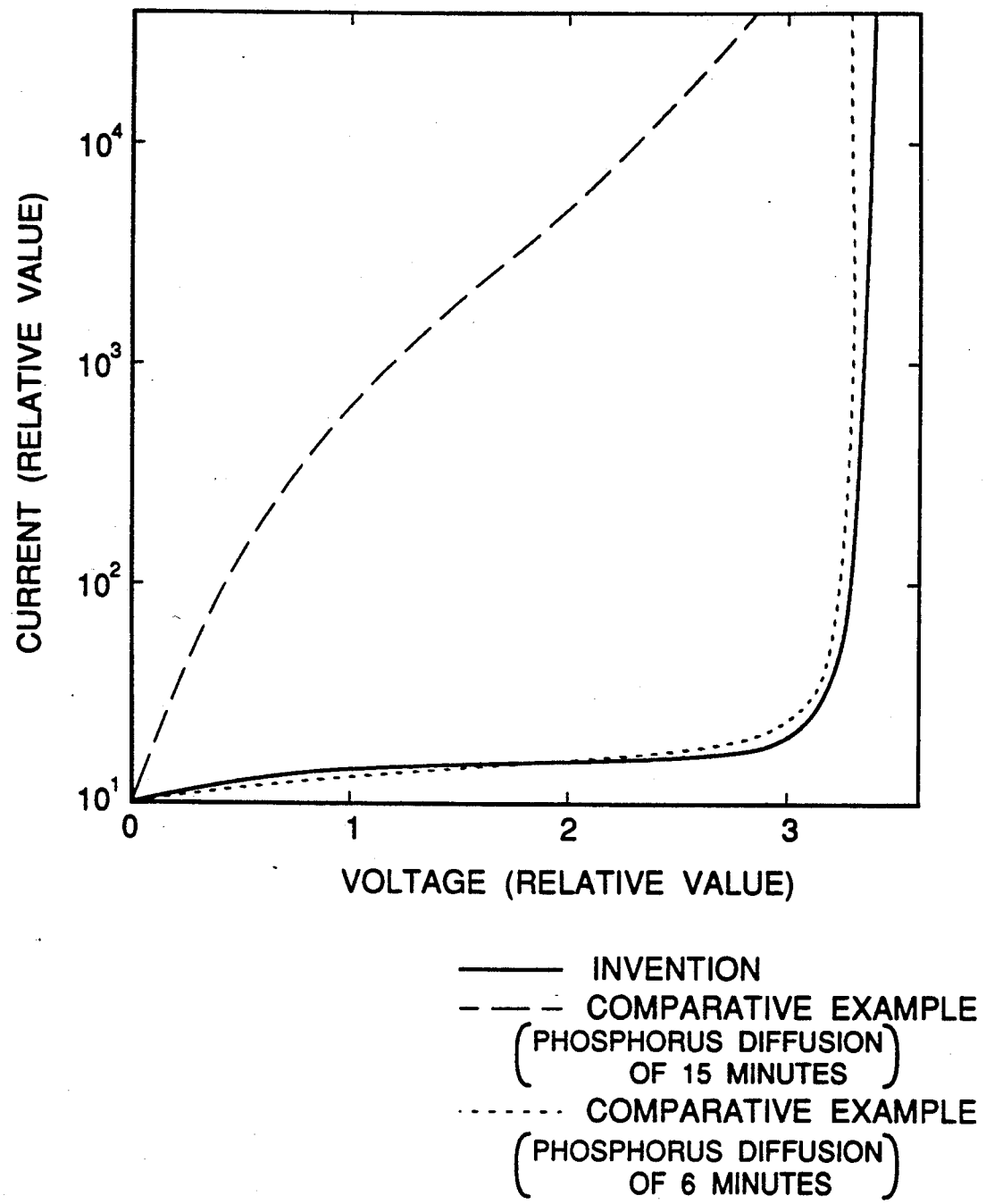
FIG. 17 is a graph illustrating collector-emitter current-voltage characteristics of a bipolar transistor of the fifth embodiment.

Furthermore, collector-emitter current-voltage characteristics were measured. FIG. 17 shows the result of the measurement. The bipolar transistor in accordance with the fifth embodiment has a leakage current which is remarkably smaller than that of the prior art bipolar transistor manufactured with the phosphorus diffusion of 15 minutes, and which is comparable to that of the prior art bipolar transistor manufactured with the phosphorus diffusion of 6 minutes.

In addition, the cutoff frequency which is one index indicative of the high frequency operation performance of the bipolar transistor was measured. The bipolar transistor in accordance with the fifth embodiment had a cutoff frequency which was 1.2 times the cutoff frequency of the prior art bipolar transistor manufactured with the phosphorus diffusion of 6 minutes. This improvement of the cutoff frequency is considered to have been obtained because the resistance of the collector region was reduced without occurrence of dislocation in the collector region.

As seen from the above, the semiconductor device in accordance with the present invention has an impurity diffused region having a reduced resistance without crystal defect and therefore without leakage which would be caused by the crystal defect. Therefore, the semiconductor device in accordance with the present invention can operate at a high speed.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device, comprising; an active region which constitutes a collector region of a bipolar transistor or a contact region to a substrate, said active region being formed of an impurity diffused region which is divided into a plurality of impurity diffused regions separated from each other but electrically coupled to each other.

2. A semiconductor device claimed in claim 1, wherein said impurity diffused region forms a collector region of a bipolar transistor.

3. A semiconductor device claimed in claim 2, wherein a contact for said collector region of said bipolar transistor is formed of polysilicon.

4. A semiconductor device, comprising: an active region which constitutes a collector region of a bipolar transistor or a contact region to a substrate, said active region being formed of an impurity diffused region which is divided into a plurality of impurity diffused regions separated from each other but electrically coupled to each other, wherein said plurality of impurity diffused regions are partitioned by a trench type device isolation region.

5. A semiconductor device, comprising: an active region which constitutes a collector region of a bipolar transistor or a contact region to a substrate, said active region being formed of an impurity diffused region which is divided into a plurality of impurity diffused regions separated from each other but electrically coupled to each other, wherein said plurality of impurity diffused regions are separated from each other by a silicon oxide.

6. A semiconductor device claimed in claim 1, wherein said impurity diffused region is divided into said plurality of impurity diffused regions by a corresponding number of diffusion windows.

* * * * *